(12) United States Patent
Chou

(10) Patent No.: US 9,154,129 B2
(45) Date of Patent: Oct. 6, 2015

(54) MULTI-ANGLE TILT SWITCH WITH A CHAMBER HAVING A FRUSTO-CONICAL INNER WALL SURFACE AND A TAPERED BOTTOM INNER WALL SURFACE

(71) Applicant: Tien-Ming Chou, Taichung (TW)

(72) Inventor: Tien-Ming Chou, Taichung (TW)

( * ) Notice: Subject to any disclaimer, the term of this patent is extended or adjusted under 35 U.S.C. 154(b) by 358 days.

(21) Appl. No.: 13/768,092

(22) Filed: Feb. 15, 2013

(65) Prior Publication Data

US 2014/0231629 A1   Aug. 21, 2014

(51) Int. Cl.
| | | |
|---|---|---|
| H03K 17/78 | (2006.01) | |
| G02B 27/00 | (2006.01) | |
| H01J 40/14 | (2006.01) | |
| G06M 7/00 | (2006.01) | |
| H03K 17/968 | (2006.01) | |
| G01B 7/30 | (2006.01) | |
| G01B 5/24 | (2006.01) | |
| G01C 9/10 | (2006.01) | |
| G01C 9/06 | (2006.01) | |

(52) U.S. Cl.
CPC ............. *H03K 17/968* (2013.01); *G01B 5/24* (2013.01); *G01B 7/30* (2013.01); *G01C 9/10* (2013.01); *G01C 2009/066* (2013.01); *G01C 2009/107* (2013.01)

(58) Field of Classification Search
CPC ............ G01B 5/00; G01B 5/24; G01B 5/241; G01B 5/245; G01B 5/25; G01B 5/252; G01B 5/255; G01B 7/00; G01B 7/30; G01B 7/305; G01B 7/31; G01B 7/312; G01B 7/315; G01B 11/26; G01B 11/27; G01B 11/272; G01C 15/002; G01C 15/004; G01C 15/006; G01C 15/008; G01C 9/00; G01C 9/02; G01C 9/04; G01C 9/06; G01C 2009/066; G01C 9/10; G01C 2009/102; G01C 2009/107
USPC .................. 250/551, 239, 221, 214 SW, 216, 250/231.14; 200/61.45 R, 61.52, 61.46, 200/61.53; 345/163–167; 356/508, 510, 356/138–155; 73/1.75, 1.77
See application file for complete search history.

(56) References Cited

U.S. PATENT DOCUMENTS

| | | | |
|---|---|---|---|
| 6,664,534 B2* | 12/2003 | Hjertman et al. ........... 250/231.1 |
| 6,690,457 B2* | 2/2004 | Yamaguchi ................. 356/139.1 |
| 7,161,138 B2* | 1/2007 | Hsu ............................. 250/231.1 |
| 2007/0277386 A1* | 12/2007 | Bozzone et al. ................ 33/391 |
| 2014/0231629 A1* | 8/2014 | Chou ..................... 250/214 SW |

* cited by examiner

*Primary Examiner* — Pascal M Bui Pho
(74) *Attorney, Agent, or Firm* — McNees Wallace & Nurick LLC

(57) ABSTRACT

A tilt switch includes a housing defining a chamber and including a frusto-conical inner wall surface having a cone angle which is less than or equal to 90 degrees, and a tapered bottom inner wall surface that defines a bottom end of the chamber, that tapers downwardly from a bottom end of the frusto-conical inner wall surface and that forms a cone angle which is greater than 90 degrees. A light emitter and a light receiver are disposed respectively at two opposite sides of the chamber. A rolling element is rollable in the chamber between blocking and unblocking positions, where the rolling element blocks and unblocks light emitted from the light emitter, respectively.

8 Claims, 10 Drawing Sheets

MULTI-ANGLE TILT SWITCH WITH A CHAMBER HAVING A FRUSTO-CONICAL INNER WALL SURFACE AND A TAPERED BOTTOM INNER WALL SURFACE

FIELD OF THE INVENTION

The invention relates to a tilt switch, more particularly to a tilt switch that forms a closed circuit or an open circuit by changing its angular position.

DESCRIPTION OF THE RELATED ART

Referring to FIG. 1, a conventional tilt switch 1 is shown to comprise a housing 11, a light emitter 12 and a light receiver 13 mounted in the housing 11, and a ball 14. The housing 11 defines a chamber 110 having a chamber axis (X), and includes a tapered bottom inner wall surface 111, and two hole passages 112 extending respectively through two opposite sides of the tapered bottom inner wall surface 111 along an optical axis (L) that is perpendicular to the chamber axis (X). Light emitted from the light emitter 12 passes through the hole passages 112 and the chamber 110 toward the light receiver 13 along the optical axis (L). The ball 14 is rollably received in the chamber 110. The tapered bottom inner wall surface 111 has a preset cone angle ($\theta$) of 90 degrees.

In a normal state, the ball 14 is disposed in the bottom inner wall surface 111 and blocks the light emitted from the light emitter 12, thereby placing the tilt switch 1 in an open circuit or "OFF" state. When the housing 11 is subjected to an external force and is tilted to an angle that is equal to or greater than an inclination angle ($\alpha$), the ball 4 will roll away from the bottom inner wall surface 111 and from the optical axis (L), so that light emitted from the light emitter 12 can pass through the chamber 110 and receive by the light receiver 13, thereby switching the tilt switch 1 from the "OFF" state to a closed circuit or "ON" state. Hence, "ON/OFF" switching of the conventional tilt switch 1 can be effected.

Since the cone angle ($\theta$) and the inclination angle ($\alpha$) are involved when the tilt switch 1 is tilted to a certain angle to control operation of an electrical appliance, for example, power on/off, generally, for safety reason, the preset angles are not large. However, in practice, it is found that when the cone angle ($\theta$) is less than or equal to 90 degrees, the ball 14 is in annular contact with the bottom inner wall surface 111. As such, the ball 14 may be clamped by and stuck to the bottom inner wall surface 111, so that "ON/OFF" switching of the tilt switch 1 cannot be effected smoothly, thereby adversely affecting operation of the tilt switch 1.

SUMMARY OF THE INVENTION

Therefore, an object of the present invention is to provide a tilt switch that is capable of overcoming the aforementioned drawback of the prior art.

According to this invention, a tilt switch comprises a housing, a photoelectric module, and a rolling element. The housing defines a chamber that has a chamber axis and opposite top and bottom ends, and includes a frusto-conical inner wall surface that surrounds the chamber axis and that has a cone angle which is less than or equal to 90 degrees, and a tapered bottom inner wall surface that defines the bottom end of the chamber, that tapers downwardly from a bottom end of the frusto-conical inner wall surface and that forms a cone angle which is greater than 90 degrees. The photoelectric module includes a light emitter and a light receiver disposed respectively at two opposite sides of the chamber. The light emitter and the light receiver cooperatively define an optical axis. Light emitted from the light emitter travels along the optical axis and passes through the chamber toward the light receiver. The rolling element is disposed in the chamber, and is rollable along the tapered bottom inner wall surface and the frusto-conical inner wall surface between a blocking position that blocks the light emitted from the light emitter, and an unblocking position that unblocks the light emitted from the light emitter so that the light can be received by the light receiver.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
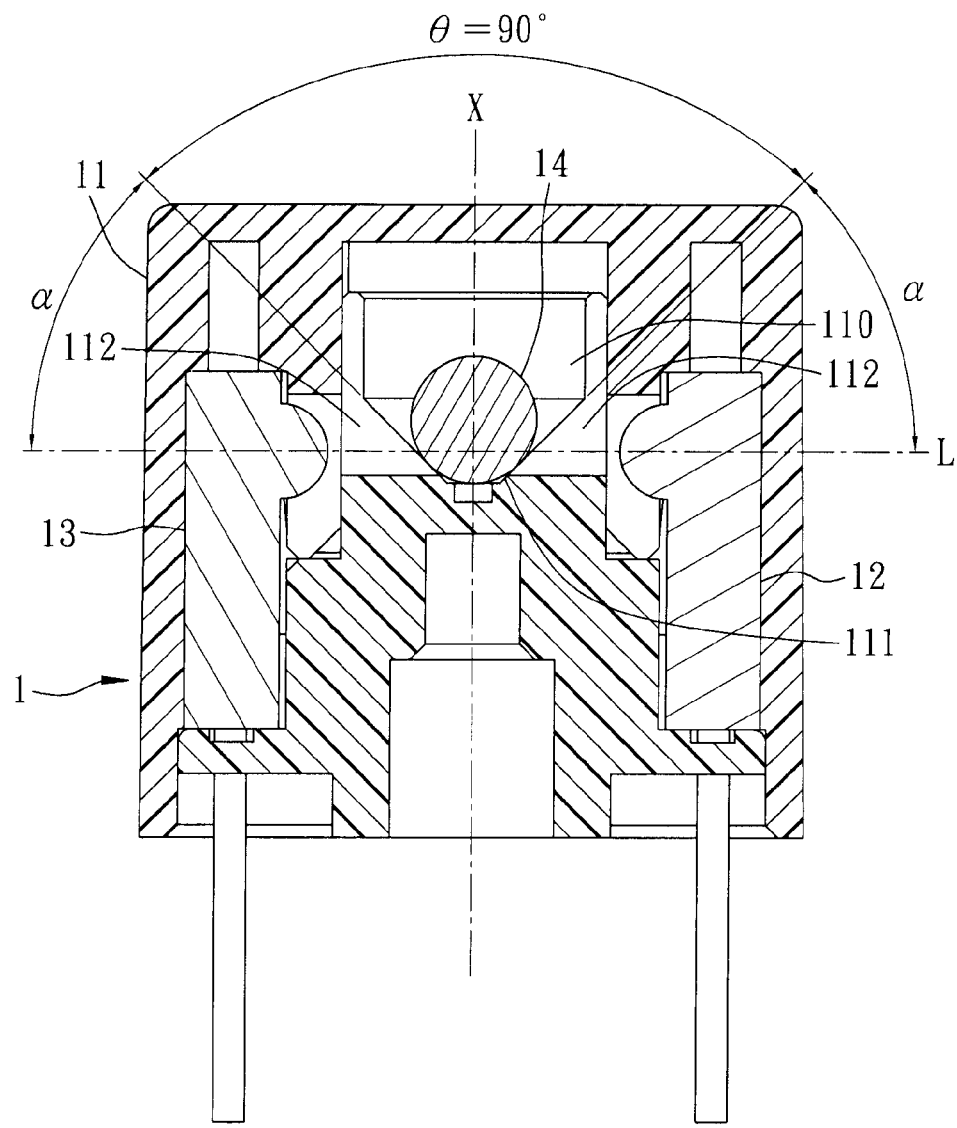
FIG. 1 is a sectional view of a conventional tilt switch.

Before the present invention is described in greater detail with reference to the accompanying preferred embodiments, it should be noted herein that like elements are denoted by the same reference numerals throughout the disclosure.

Referring to FIGS. 2 to 6, the first preferred embodiment of a tilt switch 100 according to the present invention is shown to comprise a housing 2, a photoelectric module 3 and a rolling element 4.

The housing 2 includes a base 21 and a cover 22 coupled to each other. The base 21 defines a chamber 210 having a chamber axis (X) and opposite top and bottom ends. The base 21 includes a frusto-conical inner wall surface 212 surrounding the chamber axis (X), a tapered bottom inner wall surface 211 that defines the bottom end of the chamber 210 and that tapers downwardly from a bottom end of the frusto-conical inner wall surface 212, and an annular inner wall surface 213 that extends from a top end of the frusto-conical inner wall surface 212 to the top end of the chamber 210 and that surrounds the chamber axis (X). The base 21 further includes two hole passages 214 extending along an optical axis (L) that is perpendicular to the chamber axis (X). The tapered bottom inner wall surface 211 is frusto-conical in shape, and has a flat bottom end. In this embodiment, the annular inner wall surface 213 is cylindrical in shape, the tapered bottom inner wall surface 211 has a first cone angle (θ1) which is greater than 90 degrees, and the frusto-conical inner wall surface 212 has a second cone angle (θ2) which is less than or equal to 90 degrees. Preferably, the first cone angle (θ1) is less than 180 degrees, and the second cone angle (θ2) is between 20 and 90 degrees.

The photoelectric module 3 is packaged in the housing 2 between the base 21 and the cover 22, and includes a light emitter 31 and a light receiver 32 that cooperatively define the optical axis (L). Each of the light emitter 31 and the light receiver 32 has a main body 311, 321, a pair of terminals 312, 322 extending through the housing 2, and a light-function portion 313, 323 formed at one end surface of the main body 311, 321. The main bodies 311, 321 of the light emitter 31 and the light receiver 32 are respectively disposed on two opposite sides of the chamber 210 such that the light-function portions 313, 323 of the light emitter 31 and the light receiver 32 respectively confront the hole passages 214. As such, light emitted from the light emitter 311 can travel along the optical axis (L) and pass through the chamber 210 to be received by the light receiver 32.

The tapered bottom inner wall surface 211 is inclined at a first inclination angle (β1) relative to an imaginary plane (P) that is parallel to the optical axis (L). The frusto-conical inner wall surface 212 is inclined at a second inclination angle (β2) relative to the imaginary plane (P).

Figure 2:
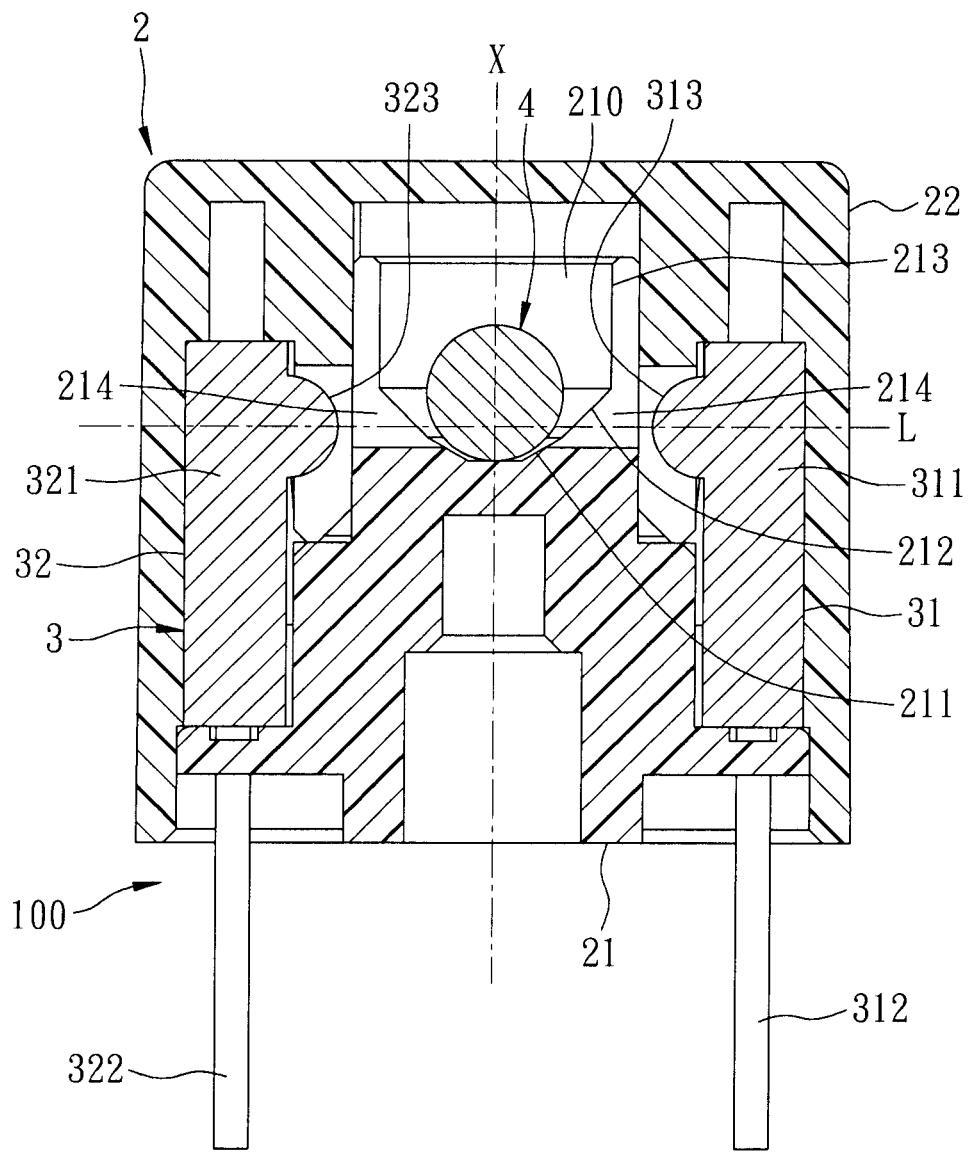
FIG. 2 is a sectional view of the first preferred embodiment of a tilt switch according to this invention.

The rolling element 4 is disposed in the chamber 210, and is rollable between a blocking position and an unblocking position. In the blocking position, as shown in FIG. 2, the rolling element 4 blocks the light emitted from the light emitter 31. In the unblocking position, as shown in FIG. 6, the rolling element 4 moves away from the optical axis (L) and unblocks the light, so that the light emitted from the light emitter 31 can be received by the light receiver 32.

In a normal state, as shown in FIG. 2, the rolling element 4 is disposed in the chamber 210 at the blocking position, so that light emitted from the light emitter 31 cannot be received by the light receiver 32, thereby placing the tilt switch 100 in an "OFF" state.

Figure 3:
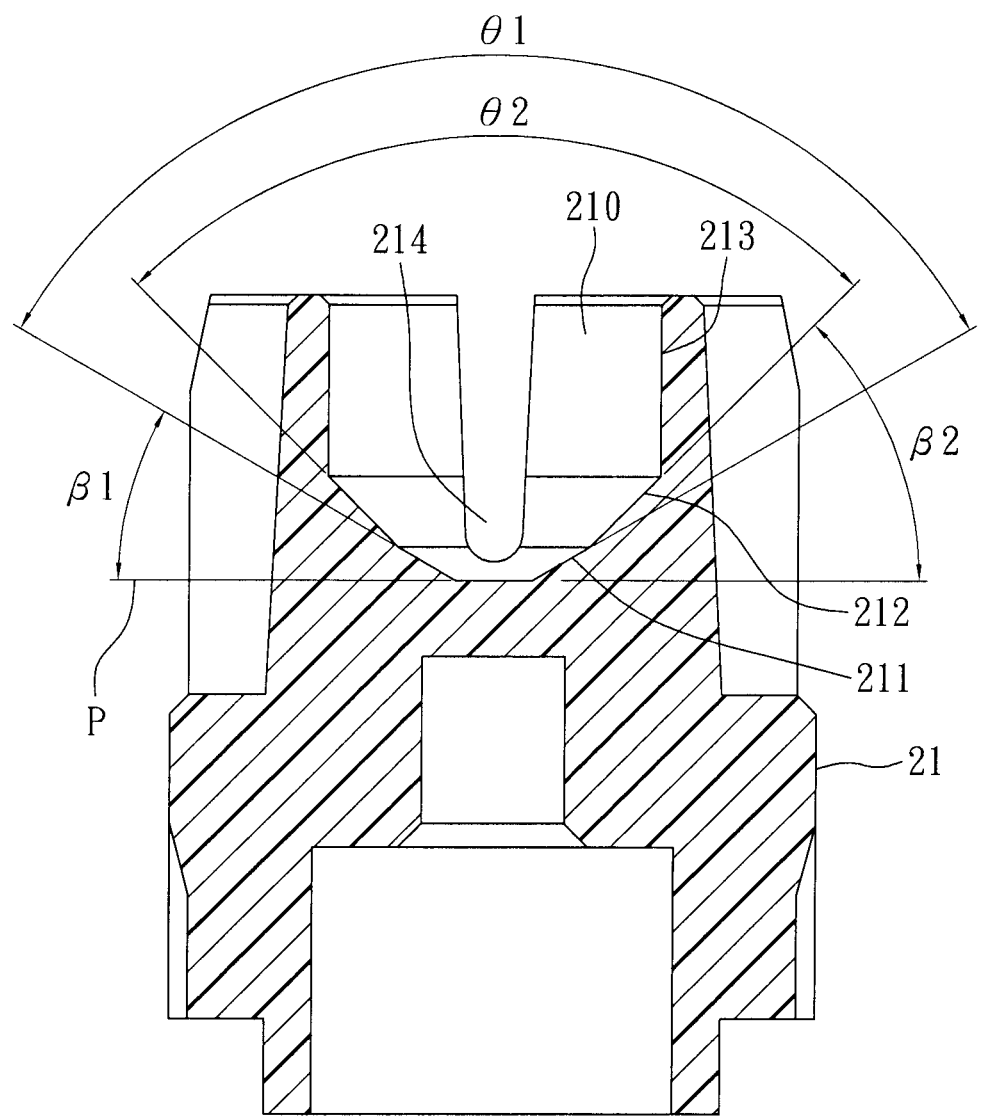
FIG. 3 is a sectional view of a base of the first preferred embodiment.
Figure 4:
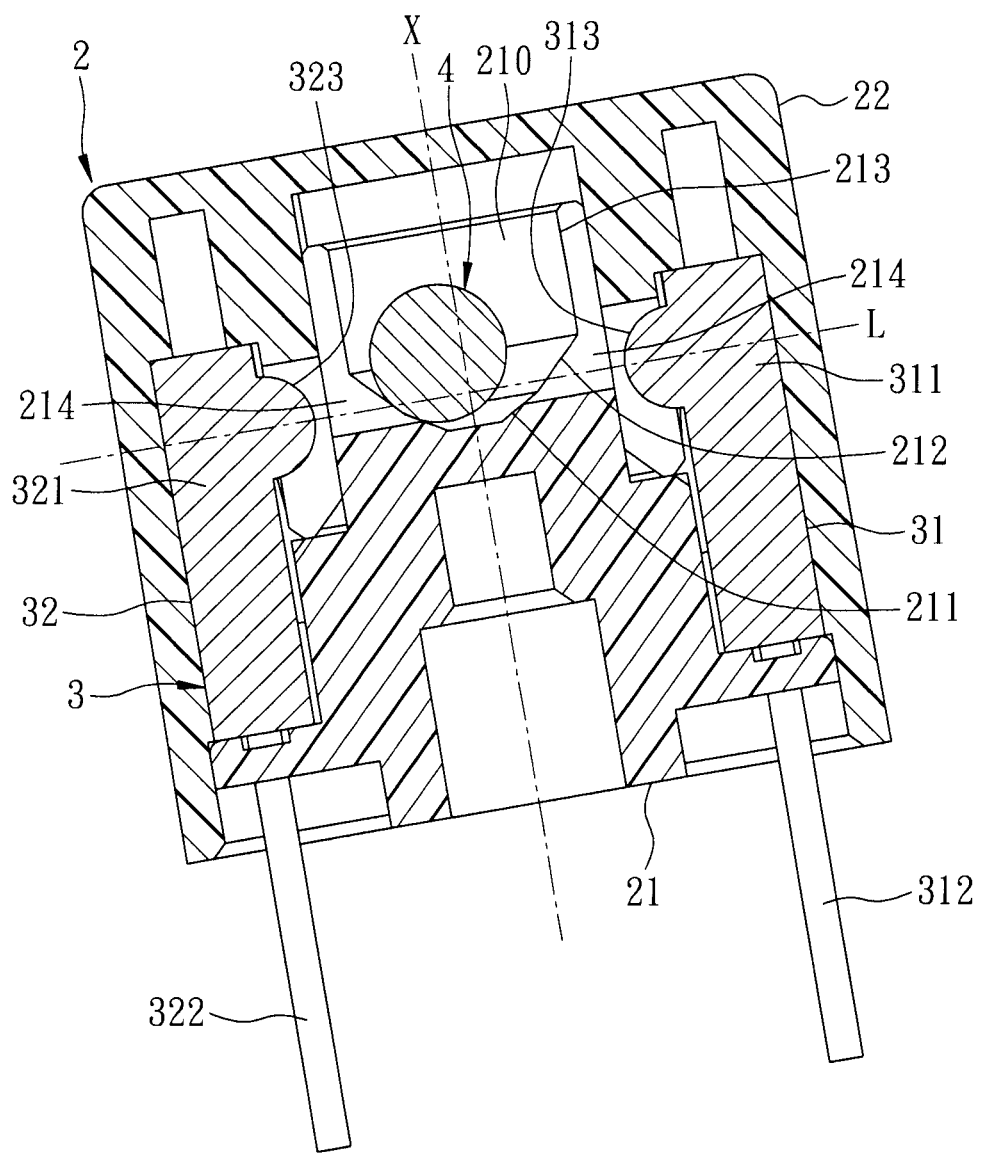
FIG. 4 is a view similar to FIG. 2, but illustrating how a rolling element rolls away from a tapered bottom inner wall surface toward a frusto-conical inner wall surface of a housing of the tilt switch when the latter is tilted.
Figure 5:
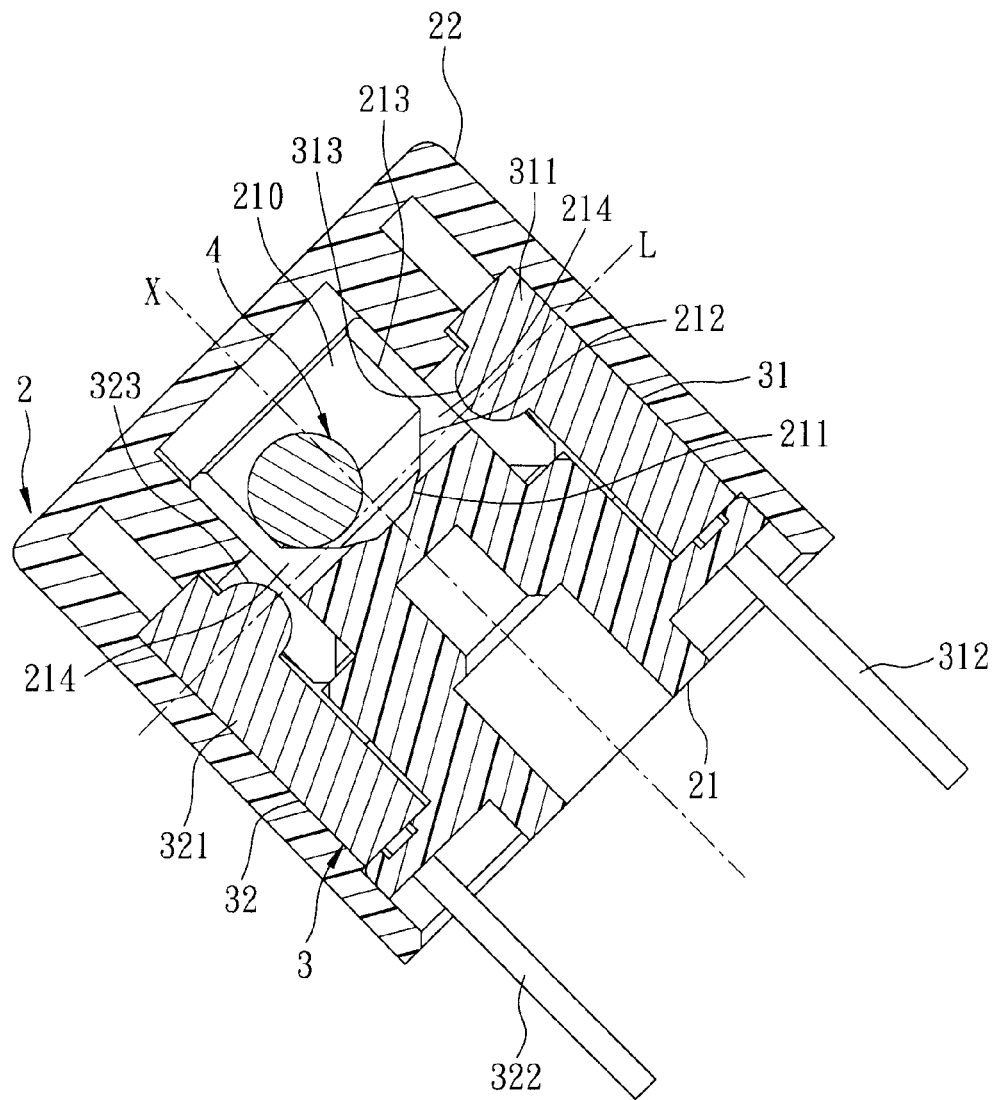
FIG. 5 is a view similar to FIG. 2, but illustrating how the rolling element rolls from the frusto-conical inner wall surface to an annular inner wall surface of the housing when the tilt switch is continuously tilted.
Figure 6:
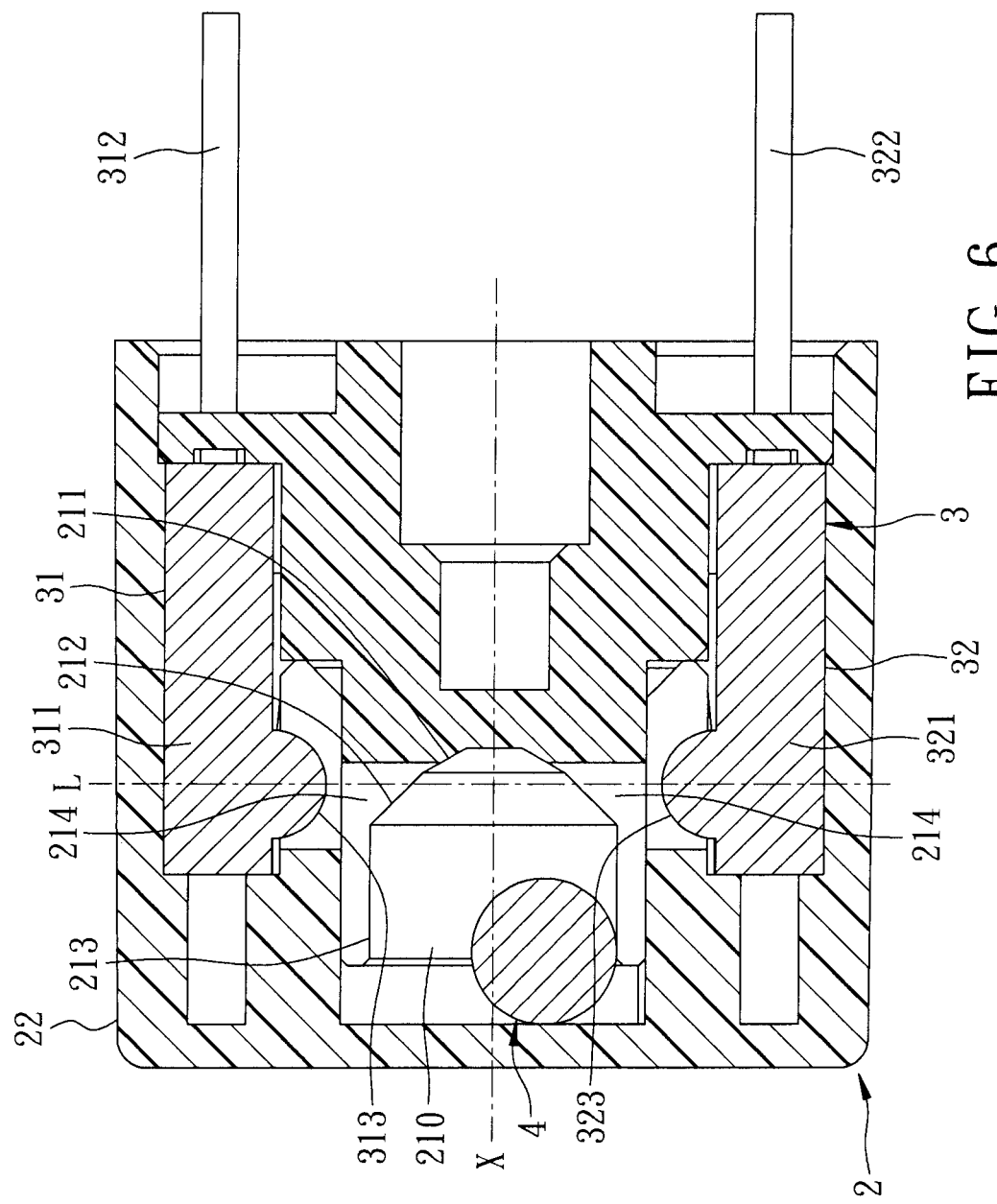
FIG. 6 is a sectional view of the first preferred embodiment, illustrating the rolling element being disposed stably on the annular inner wall surface.

Referring to FIGS. 4 to 6, in combination with FIG. 3, when the housing 2 is subjected to an external force and is tilted to an angle that is greater than or equal to the first inclination angle (β1), the rolling element 4 will roll from the tapered bottom inner wall surface 211 toward the frusto-conical inner wall surface 212 at one side of the chamber 210, but is still in a position that blocks the light (see FIG. 4). As the housing 2 is continuously tilted until the tilted angle is greater than or equal to the second inclination angle (β2), the rolling element 4 rolls from the frusto-conical inner wall surface 212 to the annular inner wall surface 213, and gradually moves away from the optical axis (L) (see FIG. 5). Finally, the rolling element 4 rolls stably to the third annular surface 213 (as shown in FIG. 6) and away from the optical axis (L), so that light emitted from the light emitter 31 can pass through the chamber 210, thereby switching the tilt switch 100 from the "OFF" state to a closed circuit or "ON" state. Hence, "ON/OFF" switching of the tilt switch 100 can be effected smoothly.

With reference to FIGS. 2 to 4, it is worth to mention that because the first cone angle (θ1) has a value greater than 90 degrees and less than 180 degrees, in a normal state, the rolling element 4 in the chamber 210 will not be in annular contact with the tapered bottom inner wall surface 211, and at most contacts only one side of the tapered bottom inner wall surface 211. Through this, clamping of the rolling element 4 by the tapered bottom inner wall surface 211 can be effectively prevented, so that the rolling element 4 cannot get stuck to the tapered bottom inner wall surface 211.

Figure 7:
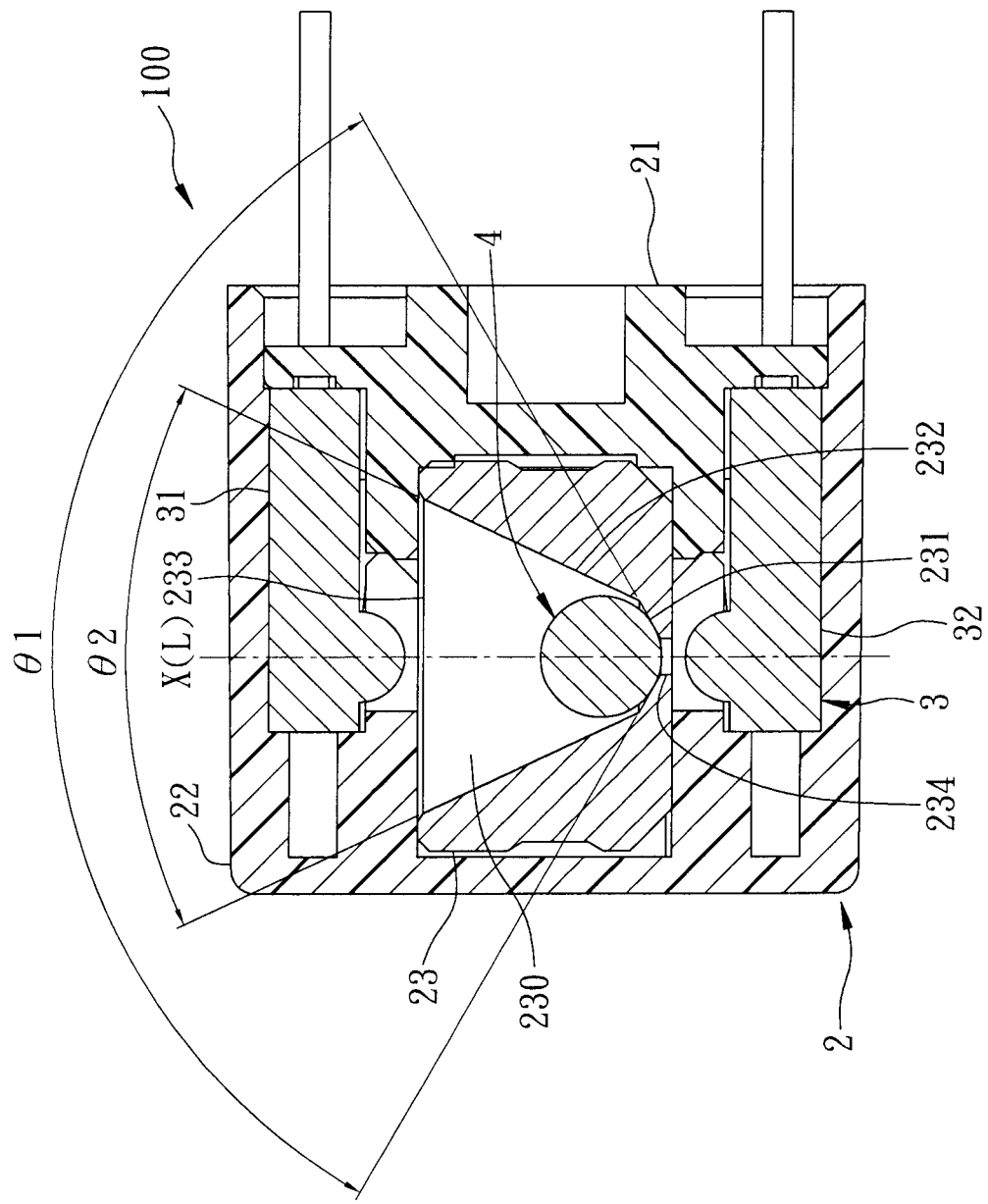
FIG. 7 is a sectional view of the second preferred embodiment of a tilt switch according to this invention.
Figure 8:
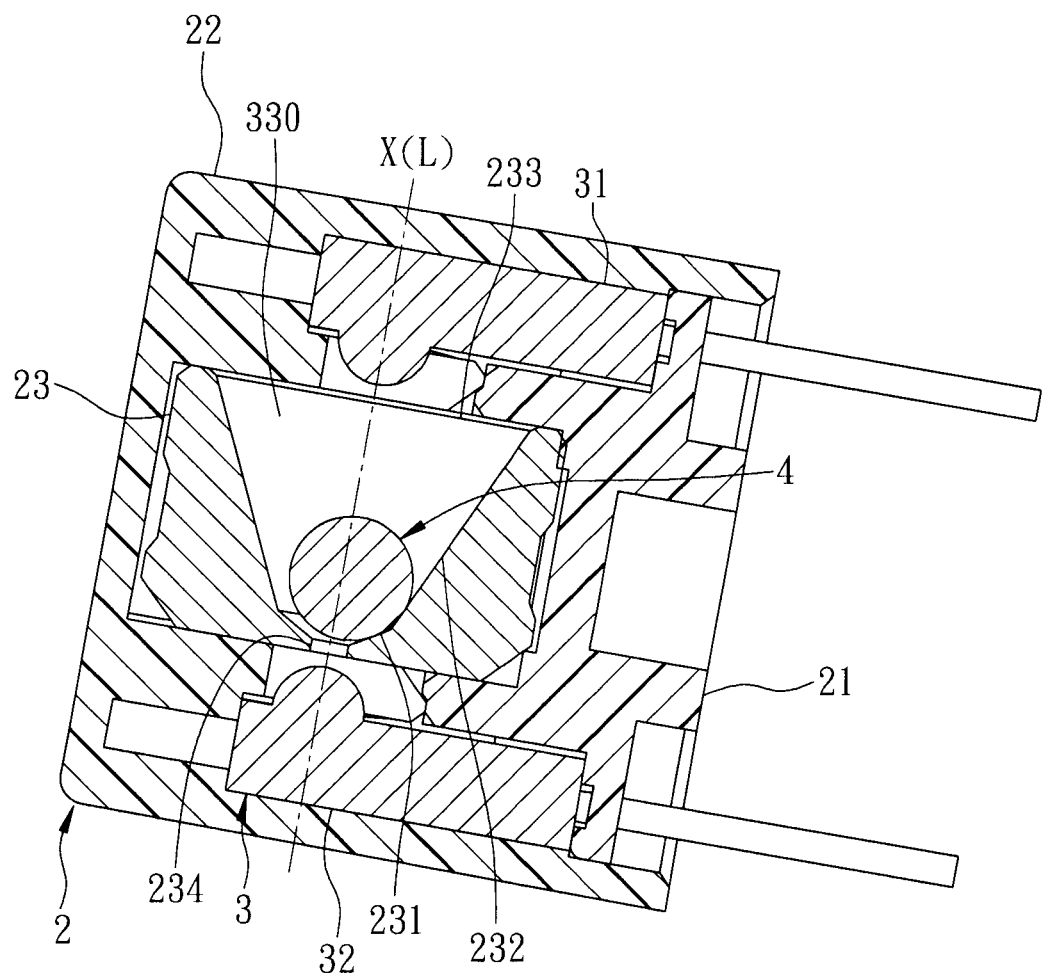
FIG. 8 is a view similar to FIG. 7, but illustrating how a rolling element rolls from a tapered bottom inner wall surface toward a frusto-conical inner wall surface of a housing of the tilt switch when the latter is tilted.
Figure 9:
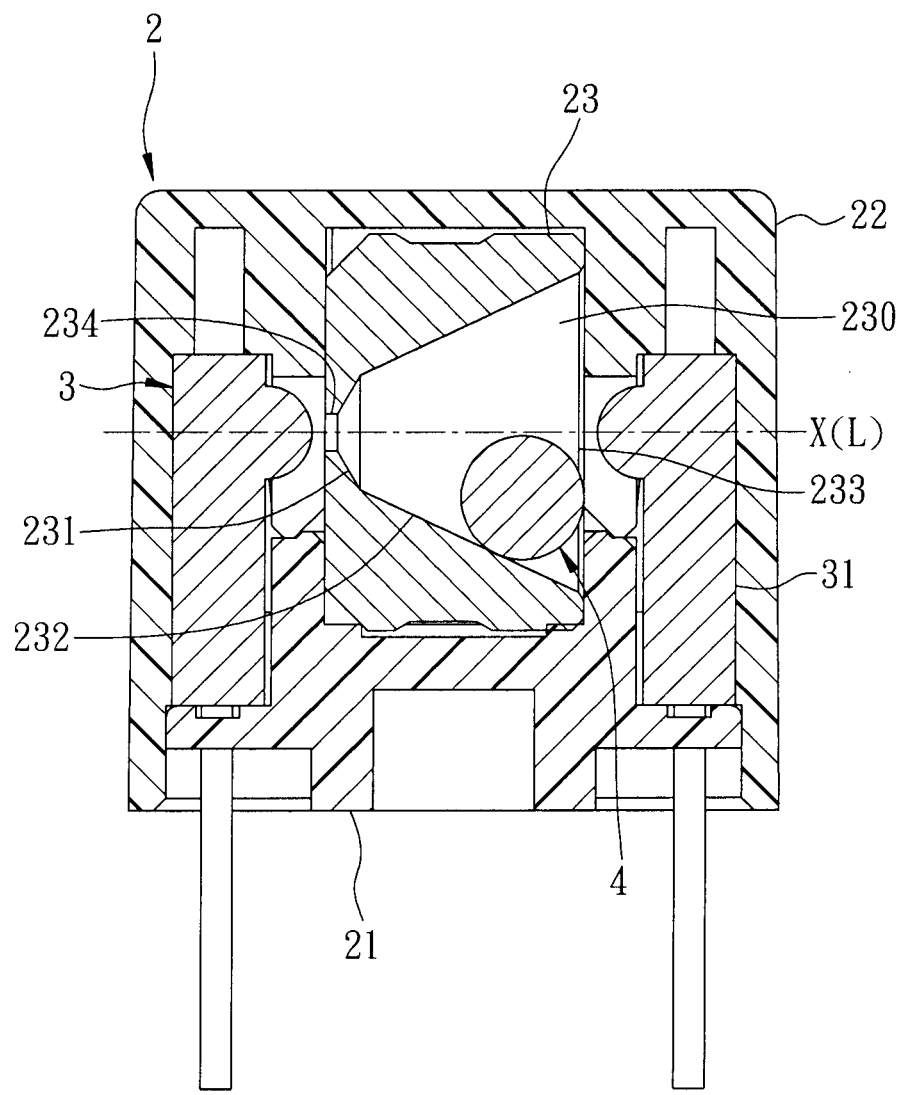
FIG. 9 is a sectional view of the second preferred embodiment, illustrating the rolling element being disposed stably on the frusto-conical surface of the housing.

Referring to FIGS. 7 to 9, the second preferred embodiment of the tilt switch 100 according to this invention is shown to be similar to the first preferred embodiment. However, in this embodiment, the housing 2 further includes an inner shell 23 disposed between the base 21 and the cover 22. The inner shell 23 defines a chamber 230 having a chamber axis (X), and includes a frusto-conical inner wall surface 232 surrounding the chamber axis (X), a tapered bottom inner wall surface 231 that defines a bottom end of the chamber 230 and that tapers downwardly from a bottom end of the frusto-conical inner wall surface 232, and an opening 233 and a hole passage 234 respectively formed at two opposite sides of the inner shell 23 and corresponding in position to top and bottom ends of the chamber 230. Similarly, the tapered bottom inner wall surface 231 has the first cone angle (θ1) which is greater than 90 degrees, and the frusto-conical inner wall surface 232 has the second cone angle (θ2) which is less than or equal to 90 degrees.

The optical axis (L) coincides with the chamber axis (X) in this embodiment.

In a normal state, as shown in FIG. 7, the rolling element 4 is disposed in the chamber 230 at a blocking position, so that light emitted from the light emitter 31 is blocked by the rolling element 4, thereby placing the tilt switch 100 in an "OFF" state.

When the housing 2 is subjected to an external force and is tilted, the rolling element 4 will similarly roll from the tapered bottom inner wall surface 231 toward the frusto-conical inner wall surface 232 at one side of the chamber 230. As the housing 2 is continuously tilted, the rolling element 4 rolls along the frusto-conical inner wall surface 212 to the unblocking position (see FIG. 9), so that light emitted from the light emitter 31 can pass through the chamber 210 and receive by the light receiver 32, thereby switching the tilt switch 100 from the "OFF" state to an "ON" state. Hence, "ON/OFF" switching of the tilt switch 100 can also be effected smoothly.

Figure 10:
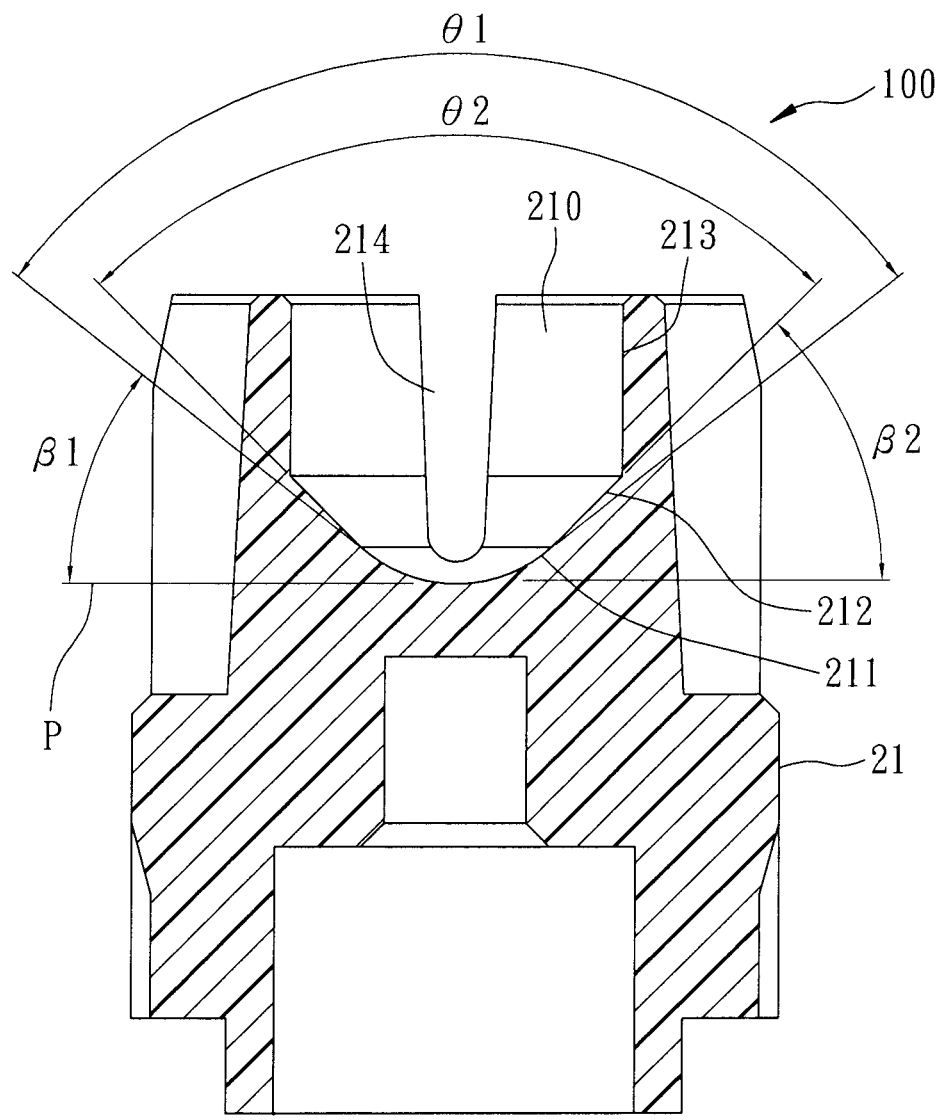
FIG. 10 is a sectional view of a base of a housing of a tilt switch according to the third preferred embodiment of this invention.

Referring to FIG. 10, the third preferred embodiment of the tilt switch 100 according to this invention is shown to be similar to the first preferred embodiment. However, in this embodiment, the tapered bottom inner wall surface 211 has a rounded bottom end. The first cone angle (θ1) is similarly greater than 90 degrees, so that in a normal state, clamping of the rolling element 4 by the tapered bottom inner wall surface 211 can be similarly prevented, and the rolling element 4 cannot get stuck to the tapered bottom inner wall surface 211.

From the aforesaid description, it is apparent that because the first cone angle (θ1) of the tapered bottom inner wall surface 211, 231 is greater than the cone angle (θ) of the tapered bottom inner wall surface 111 of the conventional tilt switch 1 (see FIG. 1), the rolling element 4 is not likely to get stuck to the tapered bottom inner wall surface 211, 231 when the housing 2 is tilted. Further, because the cone angle (θ2) of the frusto-conical inner wall surface 212, 232 is smaller than the first cone angle (θ1), the rolling element 4 can roll smoothly along the frusto-conical inner wall surface 212, 232 away from the optical axis (L). Hence, sensitivity of the tilt switch 100 of this invention during operation can be enhanced.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A tilt switch comprising:
   a housing defining a chamber that has a chamber axis and opposite top and bottom ends, and including a frusto-conical inner wall surface that surrounds said chamber axis and that has a cone angle which is less than or equal to 90 degrees, and a tapered bottom inner wall surface that defines said bottom end of said chamber, that tapers downwardly from a bottom end of said frusto-conical inner wall surface and that forms a cone angle which is greater than 90 degrees;
   a photoelectric module including a light emitter and a light receiver disposed respectively at two opposite sides of said chamber, said light emitter and said light receiver cooperatively defining an optical axis, wherein light emitted from said light emitter travels along said optical axis and passes through said chamber toward said light receiver; and
   a rolling element that is disposed in said chamber and that is rollable along said tapered bottom inner wall surface and said frusto-conical inner wall surface between a blocking position that blocks the light emitted from said light emitter, and an unblocking position that unblocks the light emitted from said light emitter so that the light can be received by said light receiver;
   wherein said cone angle of said tapered bottom inner wall surface is less than 180 degrees, and said cone angle of said frusto-conical inner wall surface is between 20 and 90 degrees; and
   wherein said rolling element in said chamber is not in annular contact with said tapered bottom inner wall surface, and at most contents only one side of said tapered bottom inner wall surface when said tilt switch is in a normal state.

2. The tilt switch as claimed in claim 1, wherein said tapered bottom inner wall surface is frusto-conical in shape.

3. The tilt switch as claimed in claim 1, wherein said tapered bottom inner wall surface has a rounded bottom end.

4. The tilt switch as claimed in claim 1, wherein said optical axis is perpendicular to said chamber axis.

5. The tilt switch as claimed in claim 1, wherein said housing further includes an annular inner wall surface that extends from a top end of said frusto-conical inner wall surface to said top end of said chamber and that surrounds said chamber axis.

6. The tilt switch as claimed in claim 5, wherein said housing includes a base and a cover coupled to each other and accommodating said photoelectric module, said base having said chamber, said tapered bottom inner wall surface, said frusto-conical inner wall surface and said annular inner wall surface.

7. The tilt switch as claimed in claim 1, wherein said optical axis coincides with said chamber axis.

8. The tilt switch as claimed in claim 7, wherein said housing includes a base and a cover coupled to each other and accommodating said photoelectric module, and an inner shell that is disposed between said base and said cover and that has said chamber, said tapered bottom inner wall surface and said frusto-conical inner wall surface.

* * * * *